US011479509B2

(12) United States Patent
Narita

(10) Patent No.: US 11,479,509 B2
(45) Date of Patent: Oct. 25, 2022

(54) MGAl$_2$O$_4$ SINTERED BODY, SPUTTERING TARGET USING THE SINTERED BODY AND METHOD OF PRODUCING MGAl$_2$O$_4$ SINTERED BODY

(71) Applicant: JX Nippon Mining & Metals Corporation, Tokyo (JP)

(72) Inventor: Satoyasu Narita, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 1 day.

(21) Appl. No.: 16/475,440

(22) PCT Filed: Nov. 20, 2018

(86) PCT No.: PCT/JP2018/042748
§ 371 (c)(1),
(2) Date: Jul. 2, 2019

(87) PCT Pub. No.: WO2019/187324
PCT Pub. Date: Oct. 3, 2019

(65) Prior Publication Data
US 2021/0017085 A1 Jan. 21, 2021

(30) Foreign Application Priority Data

Mar. 30, 2018 (JP) .............................. JP2018-069123
May 21, 2018 (JP) .............................. JP2018-096777

(51) Int. Cl.
*C04B 35/443* (2006.01)
*C04B 35/645* (2006.01)
*C23C 14/34* (2006.01)

(52) U.S. Cl.
CPC .......... *C04B 35/443* (2013.01); *C04B 35/645* (2013.01); *C23C 14/34* (2013.01); *C04B 2201/20* (2013.01); *C04B 2235/3222* (2013.01)

(58) Field of Classification Search
CPC . C04B 35/443; C04B 35/645; C04B 2201/20; C04B 2235/3222; C23C 14/34
See application file for complete search history.

(56) References Cited

U.S. PATENT DOCUMENTS 3,530,209 A   9/1970 Ho
4,273,587 A   6/1981 Oda et al.
(Continued)

FOREIGN PATENT DOCUMENTS

CN   104150895 A   11/2014
JP   S6272556   *   4/1987
(Continued)

OTHER PUBLICATIONS

Gajdowski, Caroline, et al. "Influence of post-HIP temperature on microstructural and optical properties of pure MgAl2O4 spinel: from opaque to transparent ceramics." Journal of the European Ceramic Society 37.16 (2017): 5347-5351. (Year: 2017).*
(Continued)

*Primary Examiner* — Karl E Group
*Assistant Examiner* — Cameron K Miller
(74) *Attorney, Agent, or Firm* — Howson & Howson LLP

(57) ABSTRACT

Provided is a MgAl$_2$O$_4$ sintered body, which includes a relative density of the MgAl$_2$O$_4$ sintered body being 90% or higher, and an L* value in a L*a*b* color system being 90 or more. A method of producing a MgAl$_2$O$_4$ sintered body is characterized by that a MgAl$_2$O$_4$ powder is hot pressed at 1150 to 1300° C., and is thereafter subjected to atmospheric sintering at 1350° C. or higher. Embodiments of the present invention address the issue of providing a high density and white MgAl$_2$O$_4$ sintered body and a sputtering target using the sintered body, and a method of producing a MgAl$_2$O$_4$ sintered body.

7 Claims, 8 Drawing Sheets

(56) References Cited

U.S. PATENT DOCUMENTS

| | | | |
|---|---|---|---|
| 5,152,940 | A | 6/1992 | Shibata et al. |
| 5,492,871 | A | 2/1996 | van Zyl et al. |
| 7,611,646 | B2 | 11/2009 | Nakayama et al. |
| 10,081,575 | B2 | 9/2018 | Lin et al. |
| 2011/0126899 | A1 | 6/2011 | Abe et al. |
| 2013/0327395 | A1 | 12/2013 | Abe et al. |
| 2017/0190624 | A1* | 7/2017 | Lin .................... C04B 35/64 |

FOREIGN PATENT DOCUMENTS

| | | | |
|---|---|---|---|
| JP | S6272556 | * | 5/1987 |
| JP | H01-230464 A | | 9/1989 |
| JP | 2002-154870 A | | 5/2002 |
| JP | 2002154870 | * | 5/2002 |
| JP | 2006-290688 A | | 10/2006 |
| JP | 2006290688 | * | 10/2006 |
| KR | 10-2014-0019000 A | | 2/2014 |
| KR | 10-2017-0040792 A | | 4/2017 |
| WO | 2018/096992 A1 | | 5/2018 |

OTHER PUBLICATIONS

H. Sukegawa et al., "Fabrication of Perpendicular Magnetization Films using an Ultrathin Co2FeAl/MgAl2O4 Epitaxial Stack", Journal of the Magnetics Society of Japan, vol. 39, p. 9pE-7, 2015 (month unknown).
Office Action dated Mar. 25, 2021 issued in corresponding KR Application No. 10-2019-7021702.

* cited by examiner

MGAL$_2$O$_4$ SINTERED BODY, SPUTTERING TARGET USING THE SINTERED BODY AND METHOD OF PRODUCING MGAL$_2$O$_4$ SINTERED BODY

BACKGROUND

The present invention relates to a MgAl$_2$O$_4$ sintered body, a sputtering target using the sintered body, and a method of producing a MgAl$_2$O$_4$ sintered body.

In recent years, pursuant to the miniaturization and higher recording density of magnetic disks, the research and development of magnetic recording mediums is being conducted, and various improvements in the magnetic layer, foundation layer and the like are being realized. For example, it is known that properties can be improved by using a magnesium oxide (MgO) film as the insulating layer (tunnel barrier) of a TMR device used in an MRAM. Further it was reported that effects can also be yielded by combining Fe or Co$_2$FeAl alloy with MgO (Non-Patent Document 1).

Nevertheless, there was a problem in that the TMR structure would become disarranged because the ferromagnetic materials and MgO have a difference of about 3 to 4% in the lattice constant. As a method of avoiding this lattice mismatch, MgAl$_2$O$_4$ (spinel) is being studied for use as an insulating layer rather than MgO. While the insulating layer of a TMR device is formed via sputtering, a sputtering target having the same component composition as the insulating layer is required. Patent Documents 1 and 2 disclose a MgAl$_2$O$_4$ sintered body, though of which use is not for targets.

PRIOR ART DOCUMENTS

Patent Documents

[Patent Document 1] Japanese Patent Application Publication No. H02-18354
[Patent Document 2] Japanese Patent Application Publication No. H01-230464

Non-Patent Documents

[Non-Patent Document 1] Hiroaki Sukegawa and 4 others, "Fabrication of Perpendicular Magnetization Films Using an ultrathin Co$_2$FeAl/MgAl$_2$O$_4$. Epitaxial Stack", Journal of the Magnetics Society of Japan, Vol. 39 (2015), 9pE-7, Internet (URL: https://www.magnetics.jp/kouenkai/2015/doc/program/9pE-7.pdf)

SUMMARY

Embodiments of the present invention address the issue of providing a high density and white MgAl$_2$O$_4$ sintered body and a sputtering target using the sintered body, and a method of producing a MgAl$_2$O$_4$ sintered body.

Embodiments of the present invention provide:

1) A MgAl$_2$O$_4$ sintered body, which includes a relative density of the MgAl$_2$O$_4$ sintered body being 90% or higher; and an L* value in a L*a*b* color system being 90 or more;

2) The MgAl$_2$O$_4$ sintered body according to 1), wherein an in-plane distribution of the relative density is within ±0.2%;

3) The MgAl$_2$O$_4$ sintered body according to 1), wherein an in-plane distribution of the L* value is within ±3;

4) The MgAl$_2$O$_4$ sintered body according to any one of 1) to 3), wherein an impurity concentration of the MgAl$_2$O$_4$ sintered body is less than 100 wtppm; and 5) A sputtering target using the MgAl$_2$O$_4$ sintered body according to any one of 1) to 4).

Further embodiments of the present invention provide:

6) A method of producing the MgAl$_2$O$_4$ sintered body according to any one of 1) to 4), wherein a MgAl$_2$O$_4$ powder is hot pressed at 1150 to 1300° C., and is thereafter subjected to atmospheric sintering at 1350° C. or higher; and 7) A method of producing the MgAl$_2$O$_4$ sintered body according to any one of 1) to 4), wherein a MgAl$_2$O$_4$ powder is hot pressed to attain a relative density of 79% or higher and less than 90%, and is thereafter subjected to atmospheric sintering to attain a relative density of 90% or higher.

According to embodiments of the present invention, a high density and white MgAl$_2$O$_4$ sintered body and a sputtering target using the sintered body can be produced. It is thereby possible to deposit MgAl$_2$O$_4$ films that can be industrially mass-produced based on the sputtering method.

DETAILED DESCRIPTION

Figure 1:
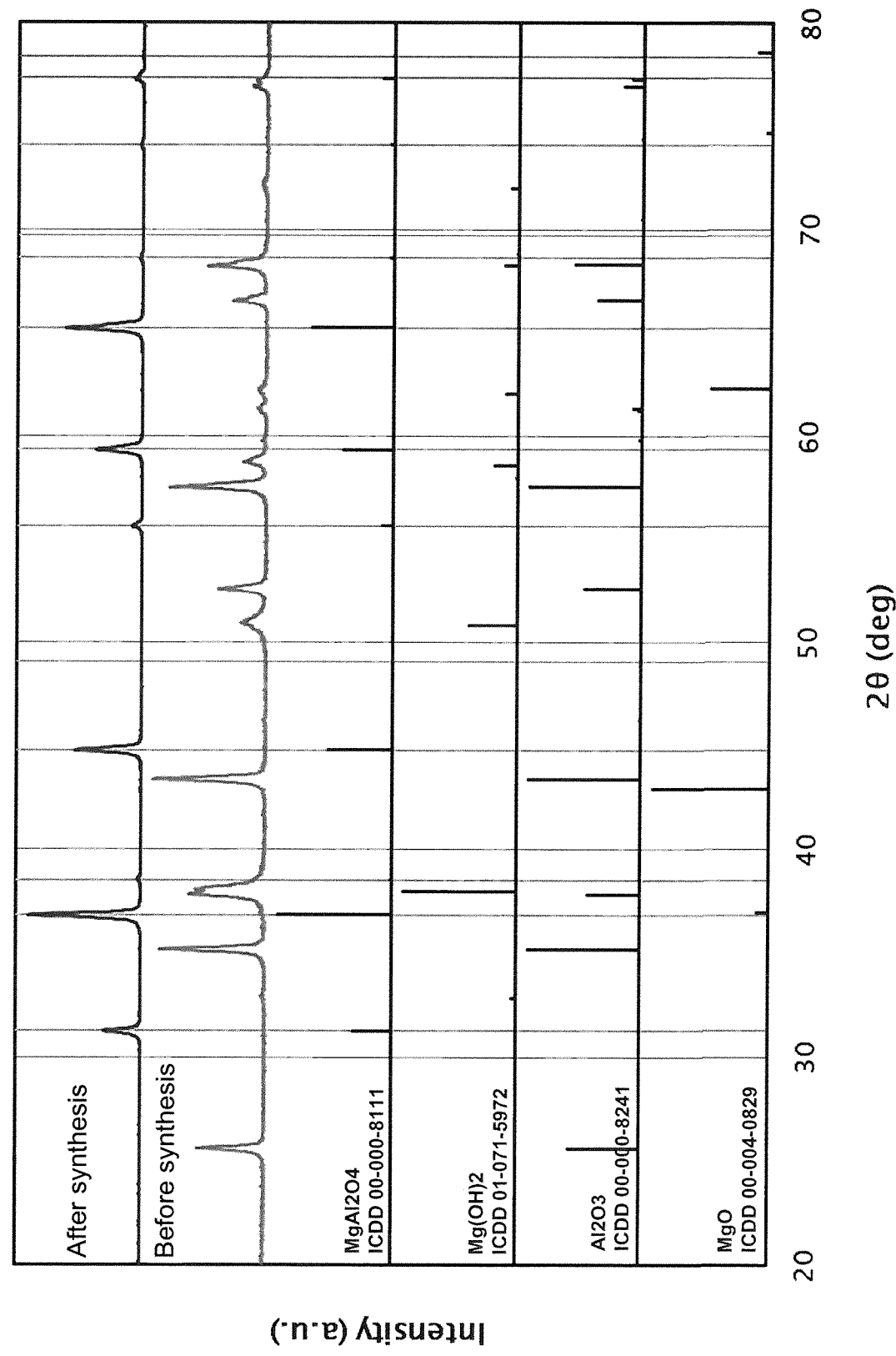
FIG. 1 is a diagram showing the X-ray diffraction peak of the synthesized MgAl$_2$O$_4$ powder.

When preparing a MgAl$_2$O$_4$ sintered body via hot press, in order to achieve a high density, the hot press temperature needs to be set to 1350° C. or higher; that is, a relative density of 95% or higher. Nevertheless, when the hot press temperature is 1350° C. or higher, due to occurrence of oxygen deficiency, the color of the sintered body will become gray or black. While there would be no problem if the overall sintered body is uniformly gray or black, uneven filling or temperature variation will cause uneven color in most cases.

When a sputtering target is produced using a sintered body having an uneven color and subsequently sputtered, the film thickness distribution of the sputtered film will reflect the uneven color. When attempting to obtain a uniform color in order to prevent the problem, there is no choice but to perform hot press at a lower temperature, i.e. 1300° C. or less. In such a case, the relative density of the sintered body will only be 90% or lower. Furthermore, a sputtering target using this kind of low-density sintered body will cause for particles.

While the relative density can be increased when $MgAl_2O_4$ is hot pressed at 1300° C. or higher, the color turns gray or black due to oxygen deficiency. Meanwhile, when $MgAl_2O_4$ is hot pressed at 1300° C. or less to prevent the foregoing gray or black color, the relative density will decrease. As the result of the intense study by the present inventors, it was found that a white and high density sintered body can be obtained by giving priority to the fact that there is no oxygen deficiency in the hot press (primary sintering) rather than the relative density, and that the high density in the atmospheric sintering (secondary sintering) performed after the hot press.

Based on the findings, a $MgAl_2O_4$ sintered body according to embodiments of the present invention has a relative density of 90% or higher, and an L* value in a L*a*b* color system is 90 or more. By causing the relative density of the $MgAl_2O_4$ sintered body to be 90% or higher, the generation of particles can be suppressed when a sputtering target using such sintered body is sputtered for forming a film. More preferably, the relative density is 95% or higher.

The relative density according to embodiments of the present invention is calculated, firstly by cutting out the sintered body into a prescribed size, measuring the dimension and weight thereof to calculate the dimensional density, by dividing the calculated dimensional density by the theoretical density of $MgAl_2O_4$:3.579 g/cm³.

Relative density (%)=dimensional density/theoretical density×100

The $MgAl_2O_4$ sintered body according to embodiments of the present invention is characterized in that the L* value in the L*a*b* color system is 90 or more. When the L* value is 90 or more, the $MgAl_2O_4$ sintered body and the sputtering target using such a sintered body can be determined to be white. The L* value indicates lightness and is so-called gray scale (L*=0 is black, L*=100 is white); and the level of whiteness of the material can be identified based on this index. For example, NF333 (optical system specification compliant with JIS Z 8722) manufactured by Nippon Denshoku Industries Co., Ltd. may be used.

The L* value according to embodiments of the present invention is obtained by taking an average of the L* values which are measured at the center and edges on the sintered body surface. With regard to the measurement of the edges, locations that are roughly 10 mm from the edge are measured in order to avoid extreme edges. Specifically, in the case of a disk-shaped sintered body (sputtering target), the center of the surface and 4 edge locations of two line segments that pass through the foregoing surface center and intersect at 90 degrees are measured, and an average value of a total of 5 measurement locations is used. While in the case of a rectangular sintered body (sputtering target), the center of the surface, 4 edge locations of two line segments that pass through the foregoing surface center and the center of each side and intersect at 90 degrees, and 4 corners of the surface are measured, and an average value of a total of 9 measurement locations is used. The measurement locations may be increased as needed.

According to embodiments of the present invention, preferably, an in-plane distribution of the relative density of the $MgAl_2O_4$ sintered body is within ±0.2%. When the in-plane distribution of the relative density is within ±0.2%, it is possible to improve the quality of the sputtered film obtained by sputtering a sputtering target using the sintered body.

Figure 5:
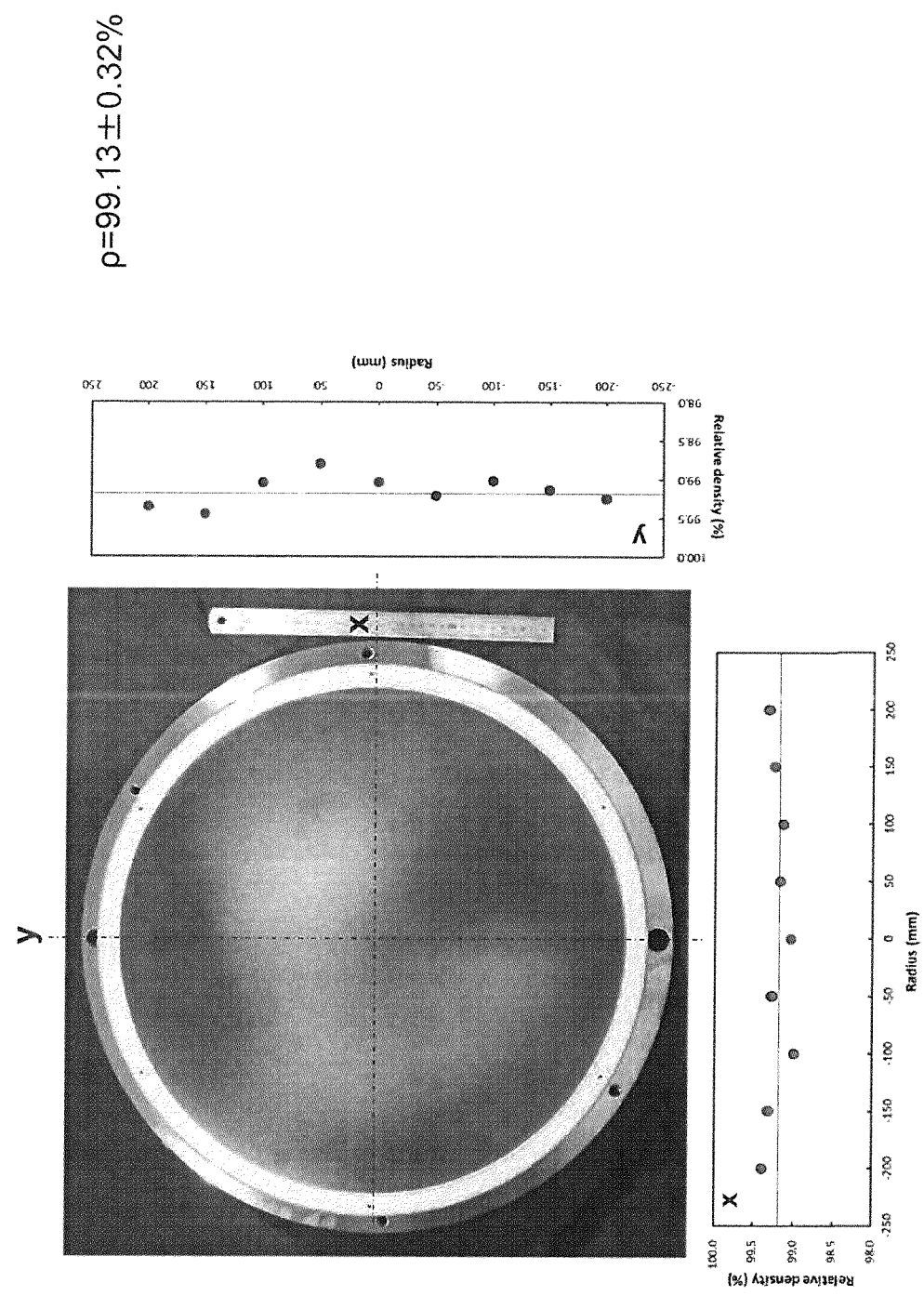
FIG. 5 is a diagram showing the in-plane distribution of the relative density of the MgAl$_2$O$_4$ sintered body in Comparative Example 24.

An in-plane distribution of the relative density is obtained by measuring the relative density of 9 locations vertically and 9 locations horizontally, a total of 17 locations in even intervals, since they mutually intersect at the center, the center is deemed 1 location as shown in FIG. 5, of the plane of the sintered body. Note that the plane corresponds to the surface to be sputtered when processed into a sputtering target.

According to embodiments of the present invention, preferably, the in-plane distribution of the L* value in the L*a*b* color system of the $MgAl_2O_4$ sintered body is within ±3. By causing the L* distribution to be within ±3, it is possible to improve the quality of the sputtered film obtained by sputtering a sputtering target using the sintered body.

Figure 4:
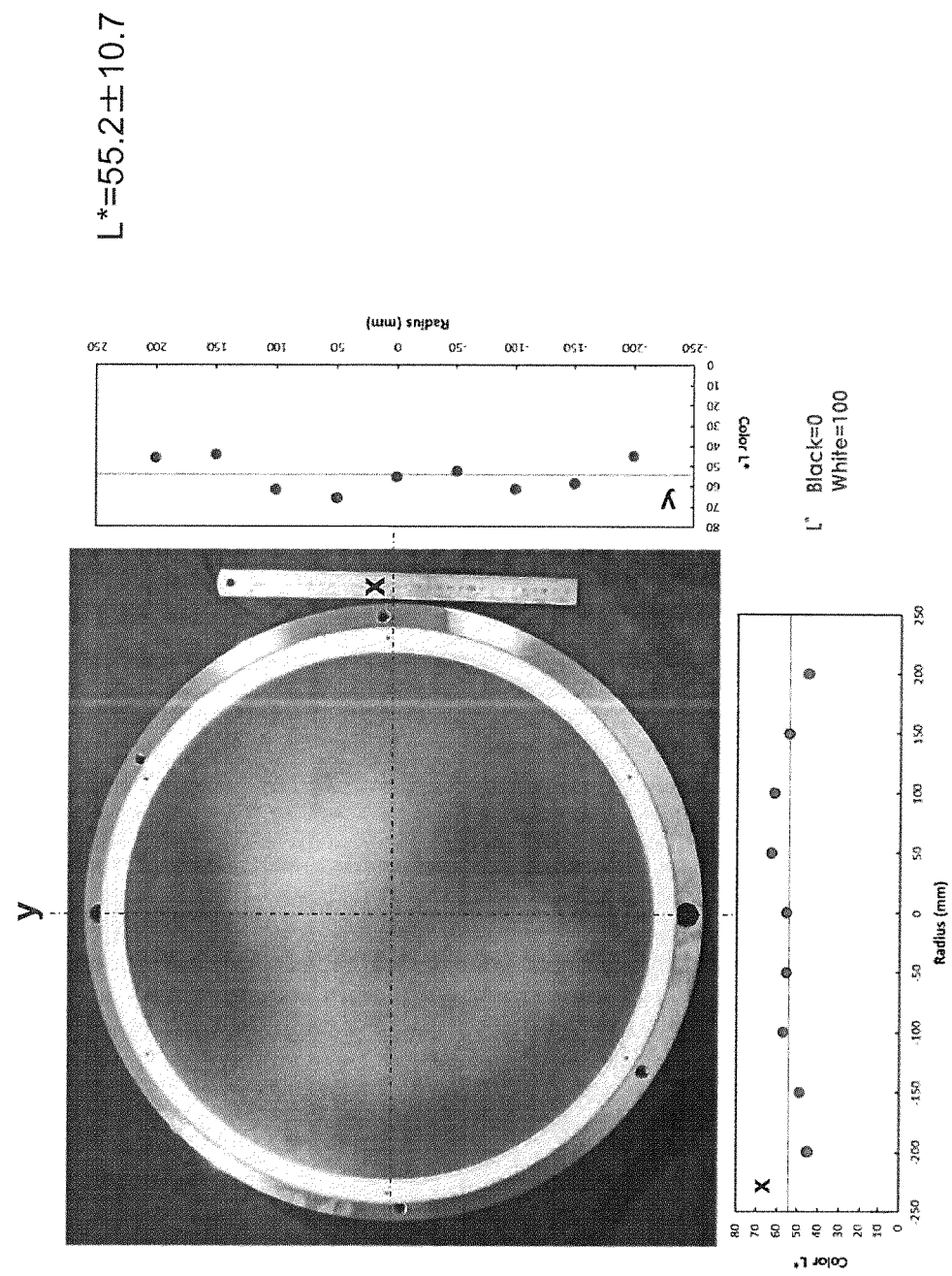
FIG. 4 is a diagram showing the in-plane distribution of the L* value of the MgAl$_2$O$_4$ sintered body in Comparative Example 24.

The in-plane distribution of the L* value is obtained in the same manner as the in-plane distribution of the relative density, namely, by measuring the L* value of 9 locations vertically and 9 locations horizontally, a total of 17 locations in even intervals (since they mutually intersect at the center, the center is deemed 1 location) as shown in FIG. 4, of the plane of the sintered body. Note that the plane corresponds to the surface to be sputtered when processed into a sputtering target Furthermore, preferably the $MgAl_2O_4$ sintered body according to embodiments of the present invention has a concentration of less than 100 wtppm. As impurities that may deteriorate the device characteristics of memory devices and the like, there are Na, Si, K, Ti, Cr, Mn, Fe, Ni, Cu, Zn, and Pb, and, therefore, the total content of these impurities is preferably less than 100 wtppm. In this disclosure, the expression of "purity of 99.99% or higher" is synonymous with the foregoing impurity concentration being less than 100 wtppm.

The sputtering target according to the embodiments of the present invention uses the $MgAl_2O_4$ sintered body according to the foregoing embodiments of the invention. For use as a sputtering target, the thickness is preferably 3 mm or more. Incidentally, the sputtering target is different in size and shape from those in Patent Documents 1 and 2 of which use is for an infrared transmitting window. It is necessary for the sputtering target in embodiments of the present invention to control particles and film thickness to a submicron size of 0.08 μm, for instance; consequently, the characteristics required are totally different from those of Documents 1 and 2.

The production method of the $MgAl_2O_4$ sintered body according to embodiments of the present invention is characterized in that a $MgAl_2O_4$ powder is hot pressed (primary sintering) at 1150° C. or higher and less than 1300° C., and is thereafter subjected to atmospheric sintering (secondary sintering) at 1350° C. or higher.

When the hot press temperature is less than 1150° C., the density cannot be sufficiently increased even by the subsequent atmospheric sintering. Meanwhile, when the hot press temperature is 1300° C. or higher, uneven color will occur due to oxygen deficiency. Hot press is performed in a vacuum or an inert atmosphere. Preferably, the pressure is 275 kgf/cm² or more and the sintering time is 2 hours or longer while this will also depend on the size of the sintered body.

After performing primary sintering with hot press, atmospheric sintering (secondary sintering) is performed at 1350° C. or higher. Here, the term "atmospheric sintering" means performing pressureless sintering in the atmosphere or an environment containing oxygen in an amount of 20% or higher. By performing secondary sintering at 1350° C. or higher after the hot press, a high density and white sintered body can be obtained. It is also possible to consequently suppress the uneven color and density variation of the sintered body surface. The sintering time is preferably 5 hours or longer while this also depends on the size of the sintered body.

The production method of the $MgAl_2O_4$ sintered body according to embodiments of the present invention is characterized by hot pressing a $MgAl_2O_4$ powder to attain a relative density (initial density) of 79% or higher and less than 90%, and thereafter performing atmospheric sintering to attain a relative density of 90% or higher. When the initial density is less than 79%, the density cannot be sufficiently increased even by the subsequent atmospheric sintering. Meanwhile, when the initial density is 90% or higher, uneven color will occur due to oxygen deficiency.

However, even when the initial density is less than 79%, there are cases where sufficiently high density can be obtained by subsequently performing atmospheric sintering at a relatively high temperature. On the other hand, even when the initial density is 79% or higher, there are cases where sufficiently high density cannot be obtained when the temperature during atmospheric sintering is low.

After performing primary sintering with hot press, and atmospheric sintering (secondary sintering), a relative density of 90% or higher is attained. As a result of attaining a relative density of 79% or higher and less than 90% by sintering with hot press in an oxygen-free atmosphere and thereafter attaining a relative density of 90% or higher by atmospheric sintering in an oxygen atmosphere as described above, a high density and white $MgAl_2O_4$ sintered body can be obtained.

By the above-described methods, the $MgAl_2O_4$ sintered body can be obtained. In the case of using the $MgAl_2O_4$ sintered body, the edges of sintered body obtained as described above are cut, the surface of the resulting $MgAl_2O_4$ sintered body is polished, and the polished $MgAl_2O_4$ sintered body is processed into a target shape to produce the sputtering target of the $MgAl_2O_4$ sintered body.

EXAMPLES

Embodiments of he present invention is now explained in detail with reference to the Examples and Comparative Examples. Note that these Examples are merely illustrative and the present invention shall in no way be limited thereby. Namely, various modifications and other embodiments are covered by the present invention, and the present invention is limited only by the scope of its claims.

<Synthesis of $MgAl_2O_4$ Powder>

First, a $MgAl_2O_4$ powder having a purity of 99.99% or higher was prepared. As raw materials, preferably the followings were prepared; a MgO powder having a grain size of 0.5 μm and a purity of 99.99% or higher and an $Al_2O_3$ powder having a grain size of 0.1 μm and a purity of 99.99% or higher. The MgO powder at 291.2 g and the $Al_2O_3$ powder at 736.8 g were placed in a resin pod having a capacity of 5 L, and 4 kg of $Al_2O_3$ balls (purity of 99.5%, φ3 mm). 1000 cc of deionized water, and 1000 cc of EL-grade ethanol were additionally placed therein, and mixed for 2 hours at a rotating speed of 100 rpm. After mixing, the mixture was placed in a Teflon-coated stainless tray, and dried.

The dried mixture was thereafter crushed and sieved with an opening of 300 μm. Note that MgO is $Mg(OH)_2$ at this point, but it is not a particular problem. Next, 300 g of the sieved mixture was placed in an alumina saggar of 150 mm×150 mm, and synthesized in the atmosphere at 1300° C. for 8 hours. FIG. 1 shows the X-ray diffraction peak before and after the synthesis. It can be understood from FIG. 1, that, before synthesis, MgO is $Mg(OH)_2$, and the product is a mixture of $Mg(OH)_2$ and $Al_2O_3$. Meanwhile, after synthesis, it turned out that the product is $MgAl_2O_4$. The thus obtained powder after synthesis was subjected to wet grinding with an SC mill using $Al_2O_3$ balls having φ1 mm to attain a grain size of 0.5 μm.

In the ensuing Examples and Comparative Examples, sintering tests were performed using the foregoing powder.

Testing Condition No. 1: Comparative Examples 1 to 3

The foregoing $MgAl_2O_4$ powder was filled in a stainless die having an inner diameter of φ32 mm, and pressed in the atmosphere at a pressure of 200 kgf/cm² and was thereafter subjected to CIP at 176 MPa. The relative density after CIP was roughly 53%. The foregoing results are shown in Table 1. Note that Comparative Examples 1 to 3 underwent treatment in several batches under the same conditions. For the measurement of the L* value in the Examples and Comparative Examples, NF333 which is an optical system specification compliant with JIS Z 8722, manufactured by Nippon Denshoku Industries Co., Ltd. was used.

TABLE 1

| No. | | Diameter mm | Hot Press Temperature ° C. | Initial Density % | Color | Atmospheric Sintering ° C. | Relative density After Atmospheric Sintering % | Density Distribution % | L* value | Distribution of L* |
|---|---|---|---|---|---|---|---|---|---|---|
| 1 | Comparative Example 1 | 32 | — | 53.0 | White | N/A | N/A | N/A | 99 | N/A |
|   | Comparative Example 2 |    | — | 53.2 |       |     |     | N/A | 98 | N/A |
|   | Comparative Example 3 |    | — | 53.1 |       |     |     | N/A | 99 | N/A |
| 2 | Comparative Example 4 | 30 | 1150 | 72.3 | White | N/A | N/A | N/A | 98 | N/A |
|   | Comparative Example 5 |    |      | 70.8 |       |     |     | N/A | 98 | N/A |
|   | Comparative Example 6 |    | 1200 | 80.7 |       |     |     | N/A | 98 | N/A |
|   | Comparative Example 7 |    |      | 78.5 |       |     |     | N/A | 97 | N/A |
|   | Comparative Example 8 |    |      | 80.1 |       |     |     | N/A | 98 | N/A |

TABLE 1-continued

| No. | | Diameter mm | Hot Press Temperature °C. | Initial Density % | Color | Atmospheric Sintering °C. | Relative density After Atmospheric Sintering % | Density Distribution % | L* value | Distribution of L.* |
|---|---|---|---|---|---|---|---|---|---|---|
| | Comparative Example 9 | | | 79.0 | | | | N/A | 98 | N/A |
| | Comparative Example 10 | | 1220 | 84.5 | | | | N/A | 96 | N/A |
| | Comparative Example 11 | | | | | | | N/A | 98 | N/A |
| | Comparative Example 12 | | 1250 | 89.4 | | | | N/A | 89 | N/A |
| | Comparative Example 13 | | | 88.6 | | | | N/A | 91 | N/A |
| | Comparative Example 14 | | 1270 | 91.3 | | | | N/A | 86 | N/A |
| | Comparative Example 15 | | | 91.8 | | | | N/A | 87 | N/A |
| | Comparative Example 16 | | 1320 | 96.6 | Gray | | | N/A | 63 | N/A |
| | Comparative Example 17 | | | 96.6 | | | | N/A | 65 | N/A |
| | Comparative Example 18 | | 1400 | 99.0 | Black | | | N/A | 42 | N/A |
| | Comparative Example 19 | | | 89.9 | | | | N/A | 40 | N/A |
| 3 | Comparative Example 20 | 480 | 1260 | 79.4 | White | | | N/A | N/A | N/A |
| | Comparative Example 21 | | 1300 | 90.0 | Gray | | | N/A | N/A | N/A |
| | Comparative Example 22 | | 1320 | 93.9 | | | | N/A | N/A | N/A |
| | Comparative Example 23 | | 1330 | 95.4 | | | | N/A | N/A | N/A |
| | Comparative Example 24 | | 1400 | 99.1 | Black | | | ±0.3 | ±55.2 | ±10.7 |
| 4 | Comparative Example 25 | 32 | — | 53.0 | White | 1350 | 67.1 | N/A | 99 | N/A |
| | Comparative Example 26 | | — | 53.2 | | 1400 | 77.4 | N/A | 99 | N/A |
| | Comparative Example 27 | | — | 53.1 | | 1450 | 87.5 | N/A | 99 | N/A |
| 5 | Comparative Example 28 | 30 | 1150 | 72.3 | White | 1350 | 84.1 | N/A | 99 | N/A |
| | Example 1 | | | 70.8 | | 1450 | 91.9 | N/A | 99 | N/A |
| | Comparative Example 29 | | 1200 | 80.7 | | 1350 | 89.0 | N/A | 99 | N/A |
| | Comparative Example 30 | | | 78.5 | | 1400 | 89.9 | N/A | 99 | N/A |
| | Example 2 | | | 79.0 | | 1450 | 94.1 | N/A | 99 | N/A |
| | Example 3 | | 1220 | 84.5 | | 1400 | 93.1 | N/A | 99 | N/A |
| | Example 4 | | | 83.7 | | 1450 | 94.9 | N/A | 99 | N/A |
| | Example 5 | | 1250 | 89.4 | | 1350 | 93.1 | N/A | 98 | N/A |
| | Example 6 | | | 88.6 | | 1400 | 94.2 | N/A | 99 | N/A |
| | Example 7 | | 1270 | 91.3 | | 1350 | 93.7 | N/A | 90 | N/A |
| | Example 8 | | | 91.8 | | 1450 | 97.4 | N/A | 92 | N/A |
| | Comparative Example 31 | | 1320 | 96.6 | Gray | 1350 | 971 | N/A | 74 | N/A |
| | Comparative Example 32 | | | 96.6 | | 1450 | 98.4 | N/A | 78 | N/A |
| | Comparative Example 33 | | 1400 | 99.0 | Black | 1350 | 99.0 | N/A | 52 | N/A |
| | Comparative Example 34 | | | 89.9 | | 1450 | 99.0 | N/A | 58 | N/A |
| 6 | Example 13 | 480 | 1260 | 79.4 | White | 1460 | 96.0 | ±0.1 | 99.4 | ±0.3 |

N/A indicates that the process has not been carried out process or the measurement has not been performed.

Testing Condition No. 2: Comparative Examples 4 to 19

Figure 2:
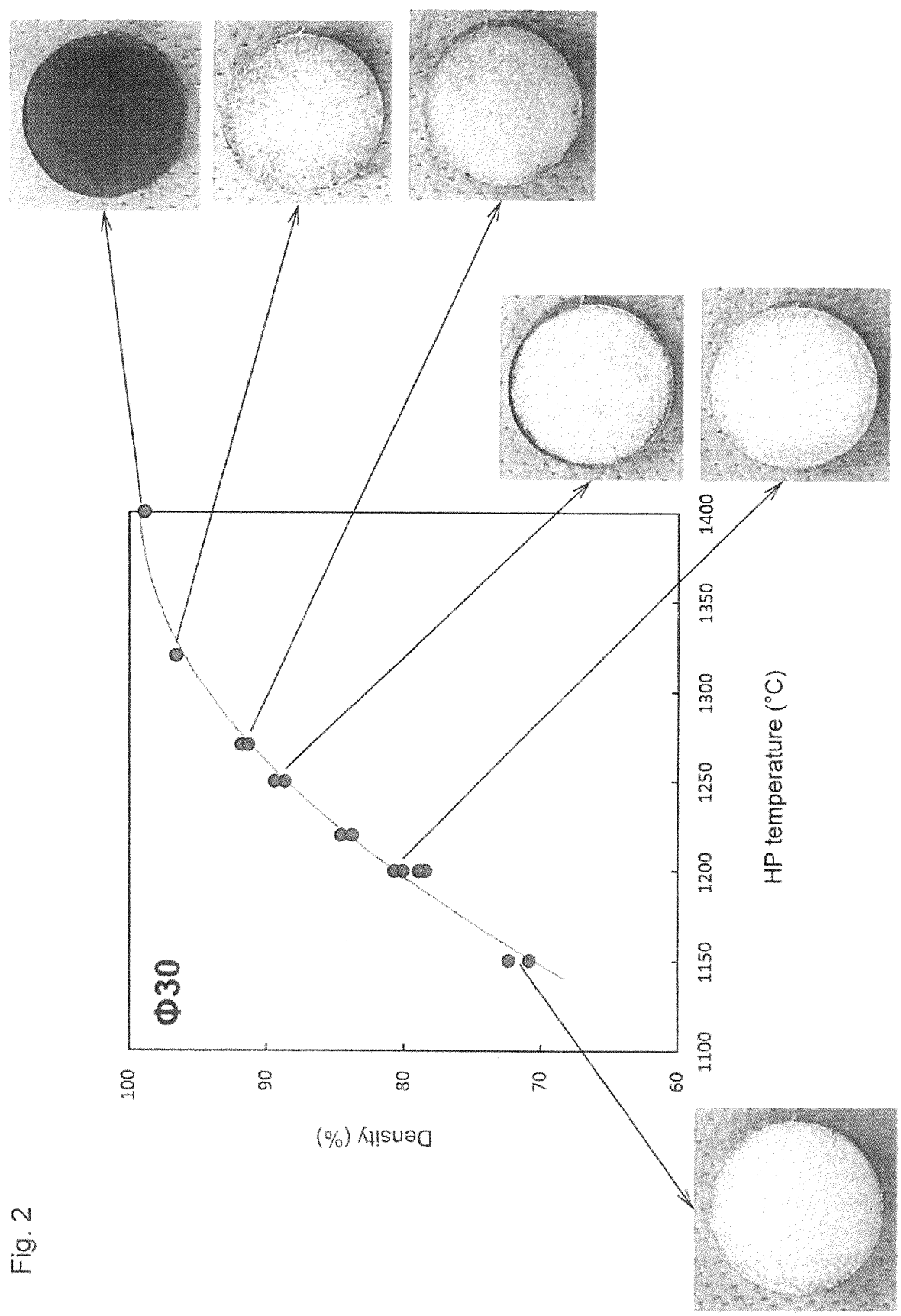
FIG. 2 is a diagram showing the relation of the hot press temperature and the relative density of the sintered body in Testing Condition No. 2, i.e. diameter of the sintered body is 30 mm.

The foregoing $MgAl_2O_4$ powder was filled in a carbon die having an inner diameter of φ30 mm, and hot pressed in a vacuum for 3 hours under the 7 temperature conditions of 1150° C., 1200° C., 1220° C., 1250° C., 1270° C., 1320° C., and 1400° C. The pressing pressure was 275 kgf/cm². As the results shown in FIG. 2, the color was white when the hot press temperature was 1150 to 1270° C., turned slightly gray at 1320° C., and turned black at 1400° C. In comparison with the relative density, the color started turning gray when the relative density reached approximately 96%. The density distribution and the L* distribution were not measured because the sample was small. The results are shown in Table 1. While there are multiple Comparative Examples in each of the temperature conditions, they underwent treatment in several batches under the same conditions.

Testing Condition No. 3: Comparative Examples 20 to 24

Figure 3:
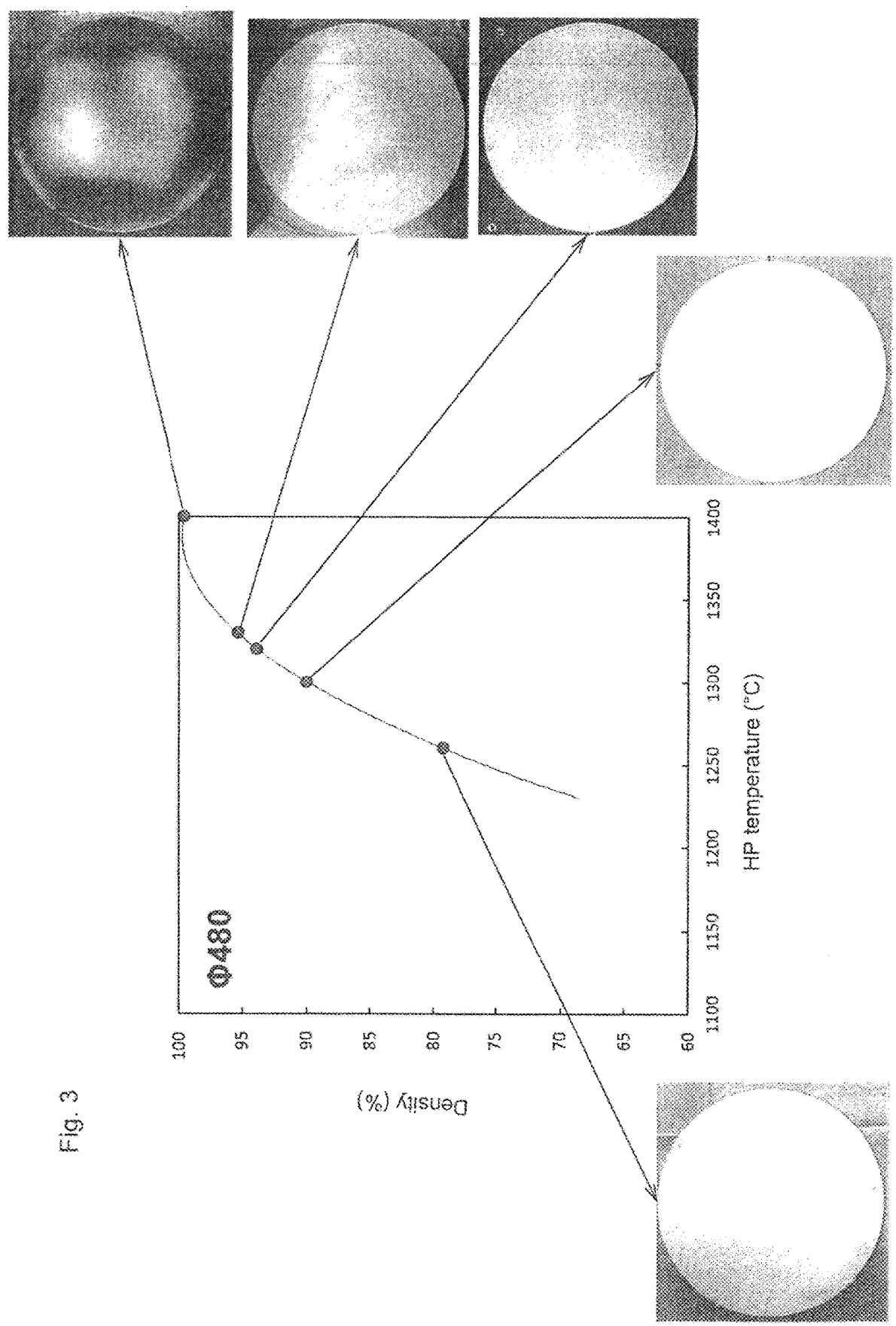
FIG. 3 is a diagram showing the relation of the hot press temperature and the relative density of the sintered body in Testing Condition No. 3, i.e. diameter of the sintered body is 480 mm.

The same raw materials were used and tests were conducted in a carbon die having an inner diameter of φ480 mm. The $MgAl_2O_4$ powder was filled in the carbon die having an inner diameter of φ480 mm, and hot pressed in a vacuum for 5 hours under the 5 temperature conditions of 1260° C., 1300° C., 1320° C., 1330° C., and 1400° C. The pressing pressure was 275 kgf/cm². The results are shown in FIG. 3. The color was white when the hot press temperature was 1260° C., but some parts started to turn gray at 1300 to 1330° C., and the color became a patch of black and white at 1400° C. It was noted some parts started to turn gray when the relative density reached roughly 90%. Accordingly, some parts started to turn gray even when the relative density was only roughly 90%, and the color would turn black when the density was further increased. While uneven color is hardly visible when the diameter of the sintered body is a small diameter of around φ30 mm, the uneven color becomes notable with a large product having a diameter of φ480 mm. The carbon die has a diameter of φ480 mm; however, the diameter became roughly φ479 mm after the hot press irrespective of the hot press temperature.

In Comparative Example 24, as a result of processing the sintered body which was hot pressed at 1400° C. into a sputtering target and sputtering the obtained sputtering target, the film thickness distribution was significant at 4.5%. The results of examining the in-plane distribution of the L* value and the relative density of the target before sputtering as shown in FIG. 4 and FIG. 5, respectively. The result of measuring a total of 17 locations every 50 mm for both the L* value and the relative density were as follows:

$L*=55.2\pm10.7$

Relative density=99.1±0.3%.

Testing Condition No. 4: Comparative Examples 25 to 27

The sintered bodies of No. 1 i.e. Comparative Examples 1 to 3, were respectively subjected to atmospheric sintering (secondary sintering). The sintering temperatures were 1350° C., 1400° C., and 1450° C., and sintering time was 5 hours. When the initial density was 79% or lower, it was not possible to obtain a $MgAl_2O_4$ sintered body having a relative density of 90% or higher even when atmospheric sintering was subsequently performed.

Testing Condition No. 5: Examples 1 to 8, Comparative Examples 28 to 34

The sintered bodies of No. 2 i.e. Comparative Examples 4 to 7, 9 to 19, were respectively subjected to atmospheric sintering (secondary sintering). The sintering temperatures were 1350° C., 1400° C., and 1450° C., and sintering time was 5 hours. Consequently, the relative density of the sintered bodies was 90% or higher and the L* value was 90 or higher, and the intended sintered bodies were obtained in Examples 1 to 8. Meanwhile, the sintered bodies that were gray or black in the initial state, i.e. after hot press did not turn white even when atmospheric sintering was subsequently performed in Comparative Examples 31 to 34. With the sintered bodies having an initial density of less than 79%, it was difficult to obtain a $MgAl_2O_4$ sintered body having a relative density of 90% or higher in Comparative Examples 28 and 30.

However, even with a sintered body having an initial density of less than 79%, it was possible to obtain a $MgAl_2O_4$ sintered body having a relative density of 90% or higher by performing atmospheric sintering at a relatively high temperature as shown in Example 1. Even with a sintered body having an initial density of 79% or higher, there were cases where it was not possible to obtain a $MgAl_2O_4$ sintered body having a relative density of 90% or higher when the atmospheric sintering was performed at a relatively low temperature as shown in Comparative Example 29.

Testing Condition No. 6: Example 13

Figure 6:
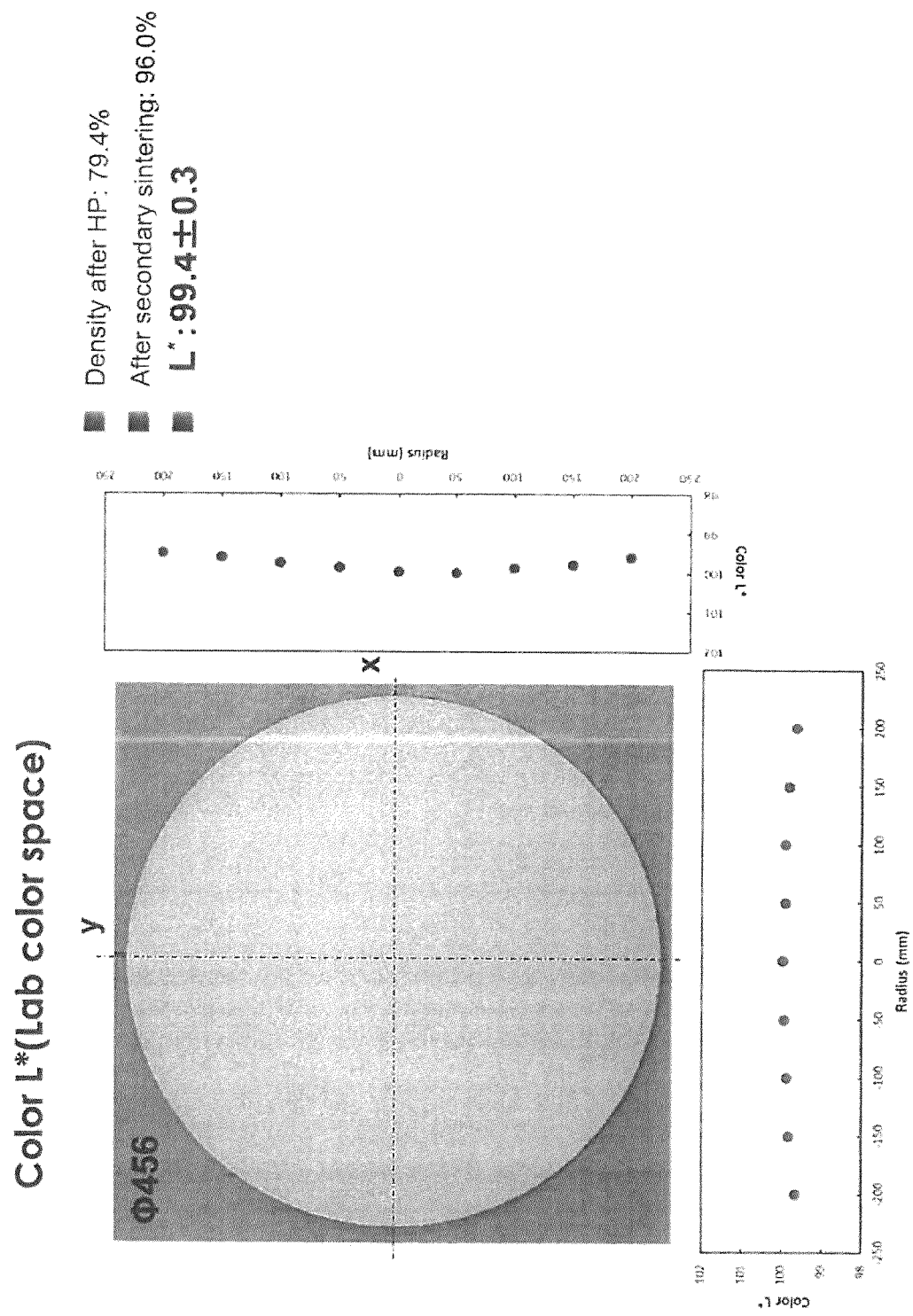
FIG. 6 is a photograph of the MgAl$_2$O$_4$ sintered body after atmospheric sintering prepared in Example 13.

The sintered body of No. 3 i.e. Comparative Example 20 was sintered in the atmosphere at 1460° C. for 5 hours. Consequently, the relative density of the $MgAl_2O_4$ sintered body was 96% and the L* value was 99.4, and the intended sintered body was obtained. The in-plane density distribution of the sintered body was ±0.1, and the in-plane distribution of the L* value was ±0.5, and it was possible to obtain a sintered body with minimal variation. Moreover, as a result of processing the $MgAl_2O_4$ sintered body into a sputtering target and sputtering the obtained sputtering target, the film thickness distribution on a 300 mm wafer was 3% and improved. FIG. 6 shows the results of examining the in-plane distribution of the L* value and the relative density of the target before sputtering. The result of measuring a total of 17 locations every 50 mm for both the L* value and the relative density were as follows:

$L*=99.4\pm0.3$

Relative density=96.0±0.1%.

The diameter of the sintered body shrunk from φ478.8 mm to φ456.2 mm.

Figure 7:
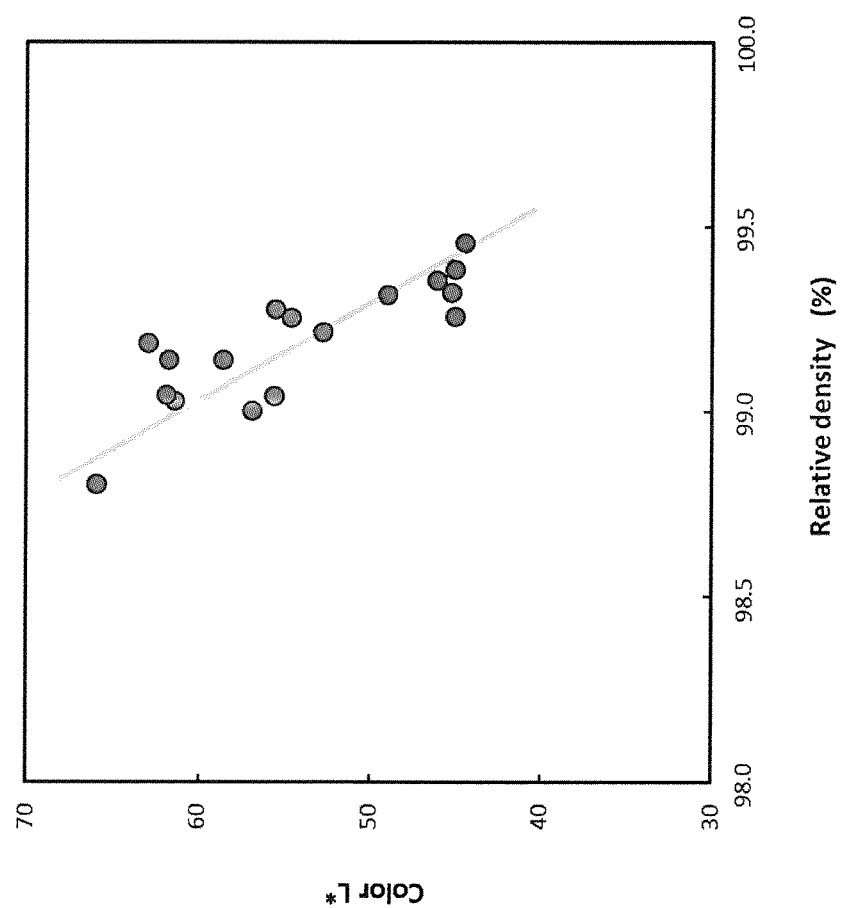
FIG. 7 is a diagram showing the relation of the relative density and the L* value of the sintered body.

In light of the foregoing results, FIG. 7 shows the relation of the relative density and the L* value of the $MgAl_2O_4$ sintered body.

As shown in FIG. 7, there is a trade-off relation where the color becomes black when the relative density is increased, and the relative density cannot be increased when a whiter color is desired. Moreover, it can be understood that there is a correlation between the color and relative density of the $MgAl_2O_4$ sintered body even in a range where the relative density is high at 98% or higher.

Figure 8:
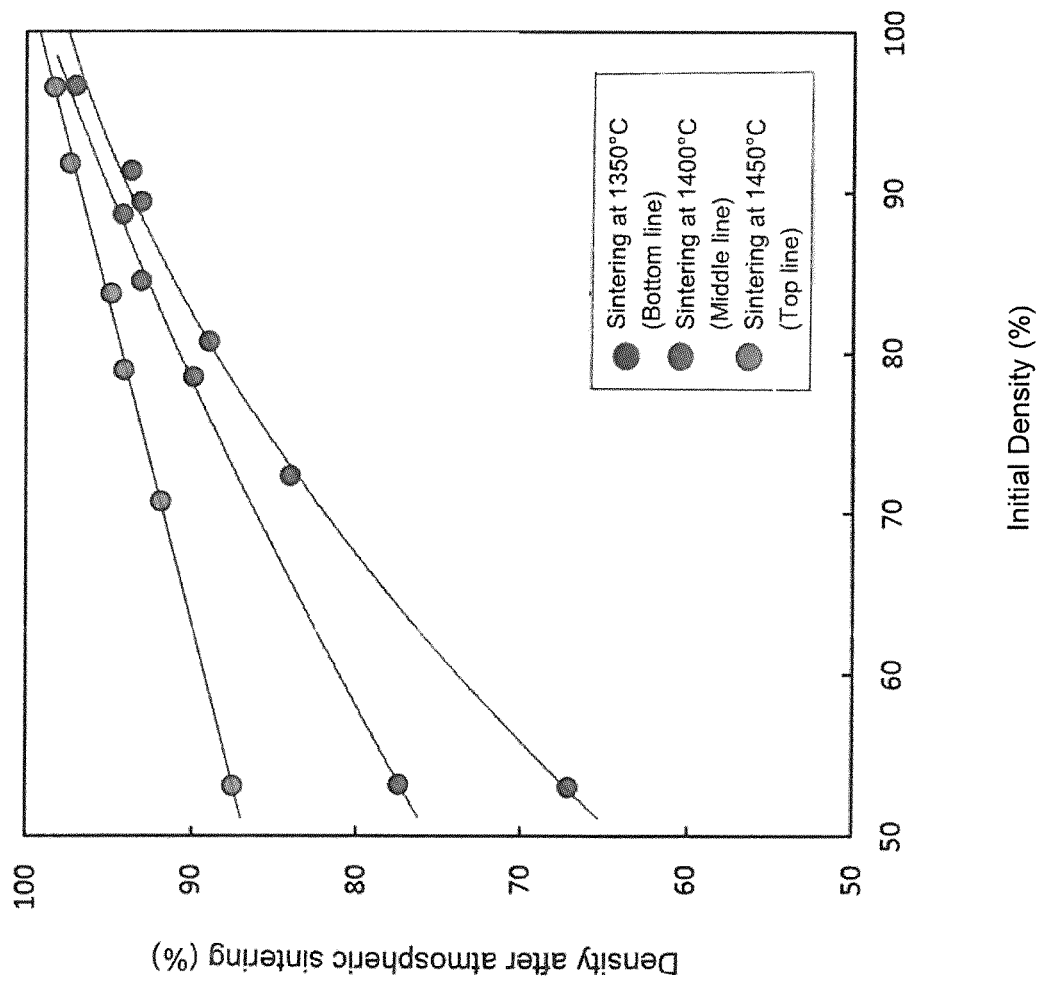
FIG. 8 is a diagram showing the relation of the relative density of the sintered body before and after atmospheric sintering.

FIG. 8 shows the relation between the initial density, which is a relative density after hot press, relative to each sintering temperature of atmospheric sintering and the relative density after atmospheric sintering.

The sputtering target using the $MgAl_2O_4$ sintered body according to embodiments of the present invention has a relative density of 90% or higher, and an L* value in a L*a*b* color system is 90 or more. Sputtering such a target will enable to improve a quality of the sputtered film, e.g., the uniformity of the film thickness and suppression of particle generation. The sputtering target according to the embodiments of the present invention is useful for forming a $MgAl_2O_4$ film as an etching stopper layer used to form three-dimensional structures such as memory devices.

The invention claimed is:

1. A $MgAl_2O_4$ sintered body comprising: a relative density of the $MgAl_2O_4$ sintered body is 90% or higher; an L* value in a L*a*b* color system is 90 or more, wherein an in-plane distribution of the L* value is within ±3; and an impurity concentration of the $MgAl_2O_4$ sintered body is less than 100 wtppm.

2. The $MgAl_2O_4$ sintered body according to claim 1, wherein an in-plane distribution of the relative density is within ±0.2%.

3. A sputtering target comprising the $MgAl_2O_4$ sintered body according to claim 1.

4. A method of producing the $MgAl_2O_4$ sintered body according to claim 1, comprising: a $MgAl_2O_4$ powder is hot pressed at 1150° C. to 1300° C.; and is thereafter subjected to atmospheric sintering at 1350° C. or higher.

5. A method of producing the $MgAl_2O_4$ sintered body according to claim 1, comprising: a $MgAl_2O_4$ powder is hot pressed to attain a relative density of 79% or higher and less than 90%; and it is thereafter subjected to atmospheric sintering to attain a relative density of 90% or higher.

6. A $MgAl_2O_4$ sintered body consisting of Mg, Al, O and less than 100 wtppm of impurities and having a relative density of 90% or higher and an L* value in a L*a*b* color system of 90 or more, wherein an in-plane distribution of the L* value is within ±3.

7. The $MgAl_2O_4$ sintered body according to claim 6, wherein an in-plane distribution of the relative density is within ±0.2%.

\* \* \* \* \*